(12) United States Patent
Reichl et al.

(10) Patent No.: US 7,782,118 B2
(45) Date of Patent: Aug. 24, 2010

(54) GATE DRIVE FOR WIDE BANDGAP SEMICONDUCTOR DEVICE

(75) Inventors: John Vincent Reichl, Ellicott City, MD (US); David Everett Bulgher, Gambrills, MD (US); Ty R. McNutt, Columbia, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 163 days.

(21) Appl. No.: 11/790,973

(22) Filed: Apr. 30, 2007

(65) Prior Publication Data
US 2008/0265980 A1    Oct. 30, 2008

(51) Int. Cl.
*H03K 17/687* (2006.01)
(52) U.S. Cl. .................. 327/427; 327/108; 327/109; 327/110; 327/111; 327/112
(58) Field of Classification Search ......... 327/108–112, 327/427
See application file for complete search history.

(56) References Cited
U.S. PATENT DOCUMENTS

| | | | | |
|---|---|---|---|---|
| 5,936,360 | A * | 8/1999 | Kaneko | 315/307 |
| 6,218,891 | B1 * | 4/2001 | Lotfi et al. | 327/431 |
| 6,661,276 | B1 * | 12/2003 | Chang | 327/427 |
| 2006/0087349 | A1 * | 4/2006 | Bird et al. | 327/112 |

OTHER PUBLICATIONS

Naefe, J.E.; Johnson, R.W.; Grzybowski, R.R., "High-temperature storage and thermal cycling studies of thick film and wirewound resistors," Components and Packaging Technologies, IEEE Transactions on , vol. 25, No. 1, pp. 45-52, Mar. 2002.*
Kelley, R.L., et al., "Inherently Safe DC/DC Converter Using a Normally-On SiC JFET", Jan. 2005, IEEE, pp. 1561-1565.

* cited by examiner

*Primary Examiner*—Lincoln Donovan
*Assistant Examiner*—John W Poos
(74) *Attorney, Agent, or Firm*—Andrews Kurth LLP

(57) ABSTRACT

A gate drive circuit for a wide bandgap semiconductor junction gated transistor includes a gate current limit resistor. The gate current limit resistor is coupled to a gate input of the wide bandgap semiconductor junction gated transistor when in use and limits a gate current provided to the gate input of the junction gated transistor. An AC-coupled charging capacitor is also included in the gate drive circuit. The AC-coupled charging capacitor is coupled to the gate input of the wide bandgap semiconductor junction gated transistor when in use and is positioned parallel to the gate current limit resistor. A diode is coupled to the gate current limit resistor and the AC-coupled charging capacitor on one end and an output of a gate drive chip on the other end When in use, the diode lowers a gate voltage output from the gate drive chip applied to the gate input of the wide bandgap semiconductor junction gated transistor through the gate current limit resistor. The gate drive circuitry provides a small, efficient, and cost effective control circuitry for a wide bandgap semiconductor junction gated transistor.

16 Claims, 5 Drawing Sheets

GATE DRIVE FOR WIDE BANDGAP SEMICONDUCTOR DEVICE

FIELD OF THE INVENTION

The invention relates generally to electronic devices, specifically to gate drive circuitry for a wide bandgap semiconductor device.

BACKGROUND OF THE INVENTION

The need for electronic devices which operate at higher frequency, higher power, higher temperature and in harsh environments has increased. For example, sensor components in jet engines or airborne microwave devices require such durable and high performance devices. Devices made using wide bandgap semiconductor materials such as silicon carbide (SiC), gallium nitride (GaN), and diamond can exhibit these properties. Generally, semiconductors having an energy difference (or energy gap (Eg)) between the top of the valence band and the bottom of the conduction band typically greater than 2 electron volts (eV) are considered wide bandgap semiconductors. Such materials are generally chemically stable at high temperatures, have good thermal conductivity, a high breakdown field and a large electron saturation velocity.

Wide bandgap semiconductor junction gated transistors (e.g., a Junction Field Effect Transistor (JFET), static induction transistor (SIT), or Metal Semiconductor Field Effect Transistor (MESFET)) require specialized gate drive or control circuitry for proper operation. Applying conventional commercial-off-the-shelf (COTS) gate drive circuitry for MOSFETs and IGBTs as-delivered for wide bandgap semiconductor devices may not be practical. A wide bandgap semiconductor circuit or device may require low gate voltages (e.g., less than 5 V). Conventional COTS gate drive circuitry may not perform well when required to drive low gate voltages required by wide bandgap semiconductor junction gated transistors. Consequently, customized gate drive or control circuitry is needed for wide bandgap semiconductor devices. For cost and availability reasons, it is desirable to modify commercially and commonly available gate drive circuits to form the gate drive or control circuitry for wide bandgap semiconductor devices.

SUMMARY OF THE INVENTION

A gate drive circuit for a wide bandgap semiconductor junction gated transistor includes a gate current limit resistor. The gate current limit resistor is coupled to a gate input of the wide bandgap semiconductor junction gated transistor when in use and limits a gate current provided to the gate input of the junction gated transistor. An AC-coupled charging capacitor is also included in the gate drive circuit. The AC-coupled charging capacitor is coupled to the gate input of the wide bandgap semiconductor junction gated transistor when in use and is positioned parallel to the gate current limit resistor. A diode is coupled to the gate current limit resistor and the AC-coupled charging capacitor on one end and an output of a gate drive chip on the other end When in use, the diode lowers a gate voltage output from the gate drive chip applied to the gate input of the wide bandgap semiconductor junction gated transistor through the gate current limit resistor. The gate drive circuitry provides a small, efficient, and cost effective control circuitry for a wide bandgap semiconductor junction gated transistor.

DETAILED DESCRIPTION

Various integrated or discrete devices can be configured using wide bandgap semiconductor materials. For example, a junction gated transistor such as a junction field effect transistor, a cascode switch or similar device may be manufactured using a wide bandgap semiconductor material. Such junction gated transistors manufactured using wide bandgap semiconductor material may offer better performance at higher operating temperatures as compared to conventional silicon (Si) based metal-oxide semiconductor field effect transistor (MOSFET) technology. Embodiments described herein provide gate drive or control circuitry for the wide bandgap semiconductor junction gated transistor. The gate drive circuitry turns the transistor on and off by applying a signal to the gate input, which controls a device current flowing from the drain to the source. Specialized control or drive circuitry is required to control a wide bandgap semiconductor junction gated transistor so that it operates at optimum performance with minimum power usage.

Figure 1:
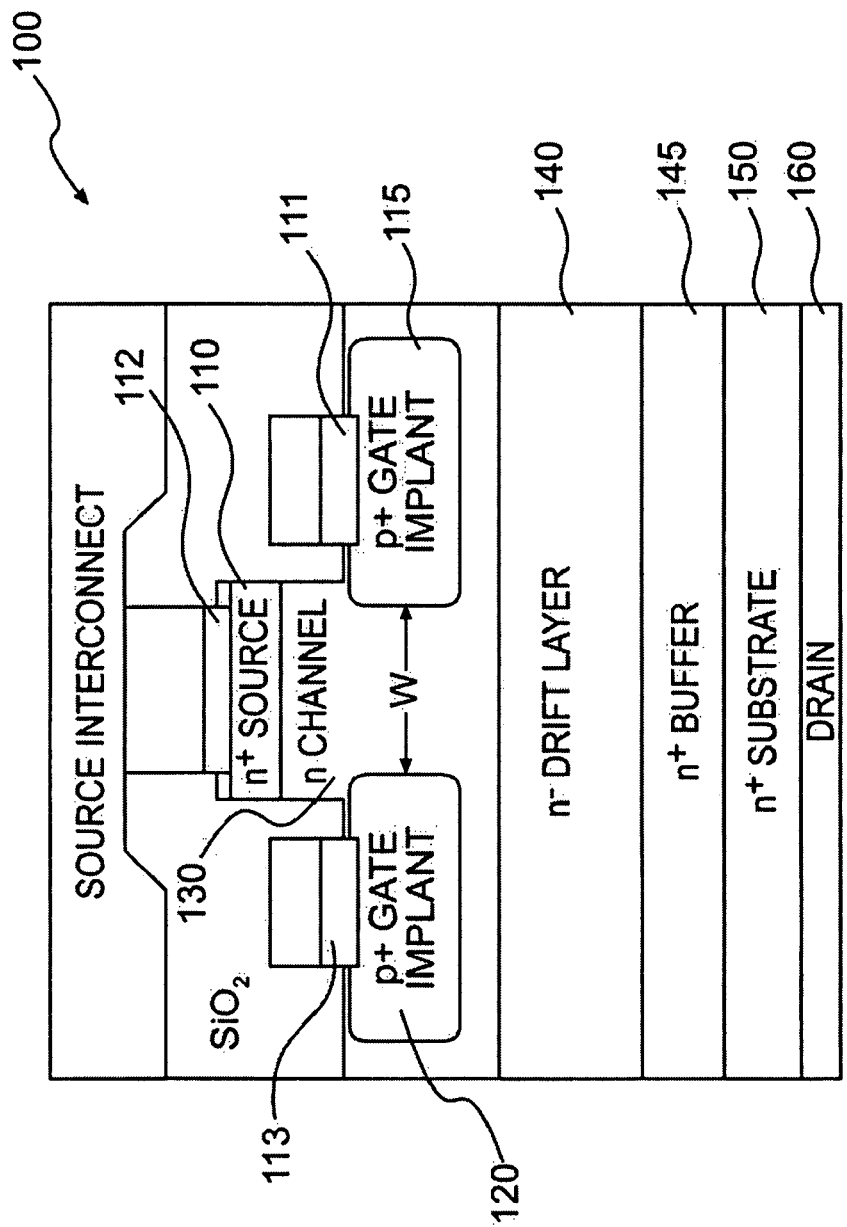
FIG. 1 illustrates a vertical junction field-effect transistor (VJFET) manufactured using a wide bandgap semiconductor.

FIG. 1 illustrates one such junction gated transistor, a vertical junction field-effect transistor (VJFET) 100, that may be fabricated using a wide bandgap semiconductor, such as SiC, GaN, diamond or other wide bandgap semiconductor material. Although a VJFET 100 is described herein, a SIT, a JFET or MESFET, for example, may also be used. The VJFET 100 includes a source terminal 112 and an N+ source region 110. A channel 130 is disposed under the N+ source region 110, as shown. The channel region 130 separates P+ implant region 120 from a P+ implant region 115. The gates 111 and 113 may be formed from a metal that makes ohmic (non-rectifying) contact to the implanted P+ material, and are electrically connected (not shown) such that they form two parts of the same gate electrode. The channel region 130 is disposed adjacent to a N type drift region 140. The N type drift region 140 is disposed adjacent to N buffer 145, which is disposed adjacent to a substrate 150. As shown, a drain contact 160 is disposed adjacent to substrate 150.

In the VJFET 100, current flows from the drain 160 to the source 112, through the channel region 130. A thick, lightly-doped drift region 140 separates a high-voltage drain 160, of the device 100, from the gates 113, 111 and source 112. The spacing W between the P+ gate regions 115 and 120, the doping of the channel region 130, and the voltage applied to these regions control the amount of current that can flow through the channel region 130. If the spacing W is large enough, the device 100 is a "normally-on" device, i.e., depletion mode, and current flows through the channel 130 when the voltage applied across the gate and the source ($V_{GS}$)=0 V. To turn a "normally on" device off, a negative $V_{GS}$ is applied, causing depletion regions from the reverse-biased P-N junctions to pinch-off the channel 130. Alternatively, if the P+ regions 115 and 120 are close together (i.e., the spacing W is small), the built-in depletion regions will pinch-off the channel 130 with no applied bias voltage ($V_{GS}$=0 V), resulting in a "normally off", i.e., enhancement mode, VJFET device. A positive voltage applied to the gate of a "normally off" VJFET device will shrink the depletion regions allowing current to flow through the channel 130. Thus, the gate 120 to gate 115 spacing W and the doping in channel 130 determine if the device is a "normally on" or "normally-off" device. A VJFET may contain hundreds (or thousands) of transistors 100 repeating the structure shown in FIG. 1, all connected in parallel to obtain high currents.

The junction field effect transistor (JFET) technology may be applied, for example, as a high-voltage normally-off JFET or by combining normally-on and normally-off JFETs into a cascode topology. The cascode topology, whether integrated or discrete, allows a device designer to yield a normally-off circuit, while benefiting from increased blocking voltage that can be achieved using SiC over silicon (Si) and maintain competitive values of the on-state resistance ($R_{on}$), which should be as low as possible.

Figure 2:
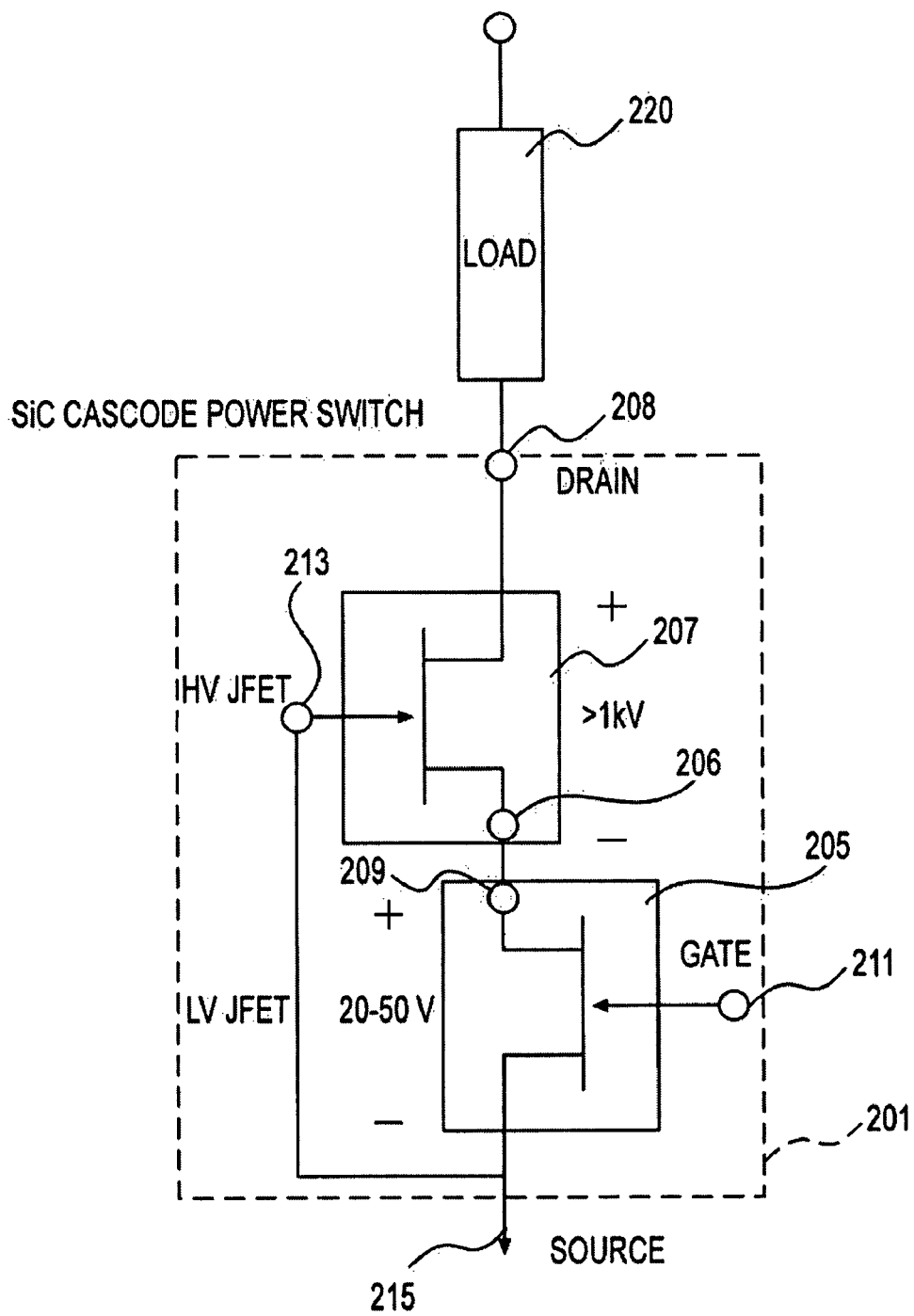
FIG. 2 illustrates a VJFET configured in a cascode topology.

FIG. 2 illustrates a cascode circuit 201 that includes two VJFETs 205 and 207 coupled to a load 220. VJFETs 205 and 207 may be fabricated using a wide bandgap semiconductor, such as SiC, GaN, diamond or other wide bandgap semiconductor material. The cascode circuit 201 configuration includes a low-voltage (blocking capability <100 V) "normally-off" (Noff) LV VJFET 205 connected in series with a high-voltage (blocking capability >300 V) "normally-on" (Non) HV VJFET 207. The cascode circuit 201 can be implemented either with two discrete devices or monolithically on a single chip. As shown, the source 206 of HV VJFET 207 is coupled to the drain 209 of the LV VJFET 205. The drain 208 of the HV VJFET 207 is coupled to one end of a load 220. The gate 213 of the HV VJFET 207 is connected to the source 215 of the LV VJFET 205 device. A voltage may be applied at gate 211 to control the cascode circuit.

In the off state, the LV VJFET 205 (normally off) initially blocks the flow of current and the voltage drop across the LV VJFET 205 may be between 10 to 100 V. The voltage across the LV VJFET 205, applied to the gate 213 of the HV VJFET 207 device, reverse-biases the gate-source junction of the HV VJFET 207, which at some low voltage (e.g., $V_{GS}$=–20 V) turns off. The HV VJFET 207 then blocks the rest of the increasing high voltage (e.g., between 300V-10 kV) across the cascode device 201. When sufficient positive voltage is applied to the gate 211 of the LV VJFET 205, the device turns "on" and the gate voltage to the gate of the HV VJFET 207 is such that the device is biased "on." Thus, the cascode topology including VJFETs fabricated using wide bandgap semiconductor material (e.g., SiC) provides high voltage blocking capability while maintaining reasonable values of on-state resistance.

The cascode topology, as described above, is preferred if a normally-off device with voltage blocking capability above approximately 300V is desired because the channel region 130 (i.e., the spacing W between the P+ gates) resistance of a single normally-off JFET begins to dominate the on-resistance for blocking voltages above 300V. Moreover, since the drift region of the high voltage device dominates the overall circuit resistance, the cascode circuit topology is desirable for a power switch device. Using a wide bandgap semiconductor normally-on VJFET device as the high voltage (HV) device, a designer can obtain low values of on-resistance ($R_{on}$) for the entire cascode circuit, while simultaneously acquiring a high blocking voltage. For example, by using SiC, an order of magnitude increase in the blocking voltage layer doping density and a decrease in the blocking voltage layer thickness by 1/10th can be obtained due to the breakdown electric field of SiC being 10 times higher than Si, hence yielding low $R_{on}$ values for the SiC normally-on device.

The normally-off LV VJFET 205, shown in FIG. 2 has a low on-state resistance ($R_{on}$) value. In one example, the LV JFET 205 may be designed to block approximately <100 V, thus providing sufficient reverse gate-source bias on the high voltage device (e.g., HV VJFET 207) to promote current pinch-off. Conventionally, the low voltage device (e.g., LV JFET 205) is a low voltage Si MOSFET. However, as described herein, the low voltage Si MOSFET is replaced with a low voltage wide bandgap semiconductor device, such as a normally-off VJFET manufactured using SiC, which can operate at higher temperatures. By using a wide bandgap semiconductor, e.g., SiC, and the VJFET device technology, the cascode circuit may provide 1) a device having a wide energy band gap that operates at higher temperatures than conventional MOS devices; 2) the higher breakdown electric field in wide bandgap semiconductors that allows for a low $R_{on}$ in both the normally-off device and normally-on device; and 3) the elimination of the low voltage Si MOSFET that can greatly reduces the gate capacitance of the cascode circuit.

Figure 3:
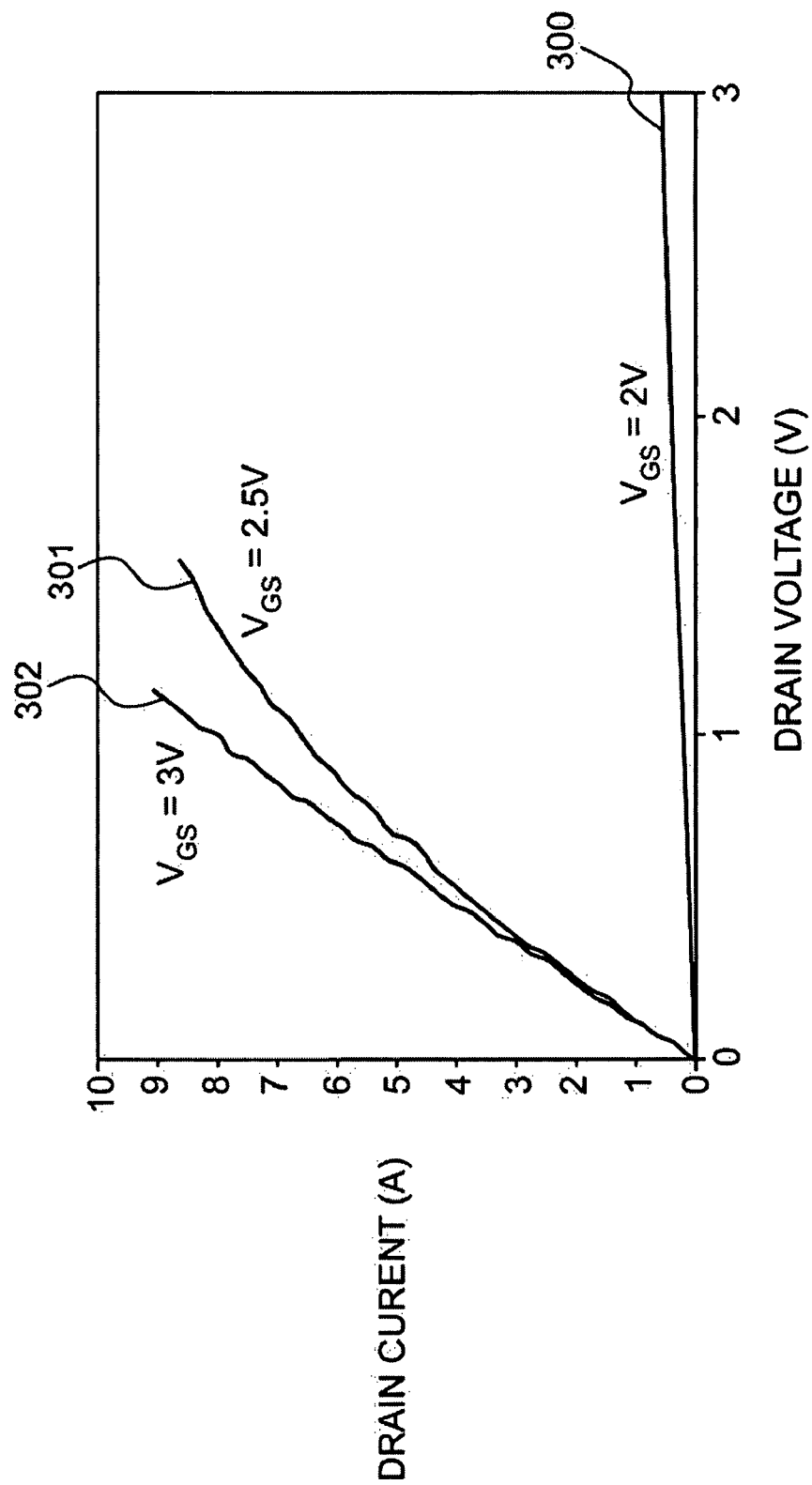
FIG. 3 is a graph illustrating the cascode topology device operation.

The cascode configuration as shown in FIG. 2 has been experimentally investigated and measured output characteristics are shown in the graph of FIG. 3. FIG. 3 shows the drain voltage (V) (i.e., at drain 208) of the circuit 201 (X-axis) vs. the drain current (A) (i.e., through drain 208) (Y-axis), as a function of $V_{GS}$. As shown, $V_{GS}$ applied to the gate-source junction of the normally-off device LV JFET 205 directly affects the output characteristics of the cascode circuit 201. At $V_{GS} \geq 2$ V, the normally-off device is not affected and the drain current is at its minimum, as shown by curve 300. However, the P-N junction of the normally-off gate-to-source diode becomes fully conducting at approximately $V_{GS} \geq 2.5$ V. Once the P-N junction of the normally-off gate-to-source diode becomes fully conducting, only minimal benefit in the on-resistance of the device occurs as $V_{GS}$ increases from 2.5 V (curve 301) to 3V (curve 302), as shown in FIG. 3. Therefore, to save power and limit the size of a gate drive circuit needed to control the cascode circuit (or VJFET) or other wide bandgap semiconductor junction gated transistors, it is advantageous to limit the gate voltage to values such that the P-N junction does not fully turn-on, yet the $V_{GS}$ is at the maximum possible voltage prior to the P-N junction turn-on to ensure a low on-resistance. Therefore, for a given device active area, a gate-source current can be chosen such that the maximum voltage is always on the gate-source junction during the on-state no matter what the temperature.

In addition, during device "turn-on" and "turn-off" transients, the input gate-source and gate-drain capacitances must be charged or discharged as fast as possible for low device turn-on and turn-off speeds. Therefore, limiting the input gate current to a single value slows down the turn-on speed of the transistor or device.

Figure 4:
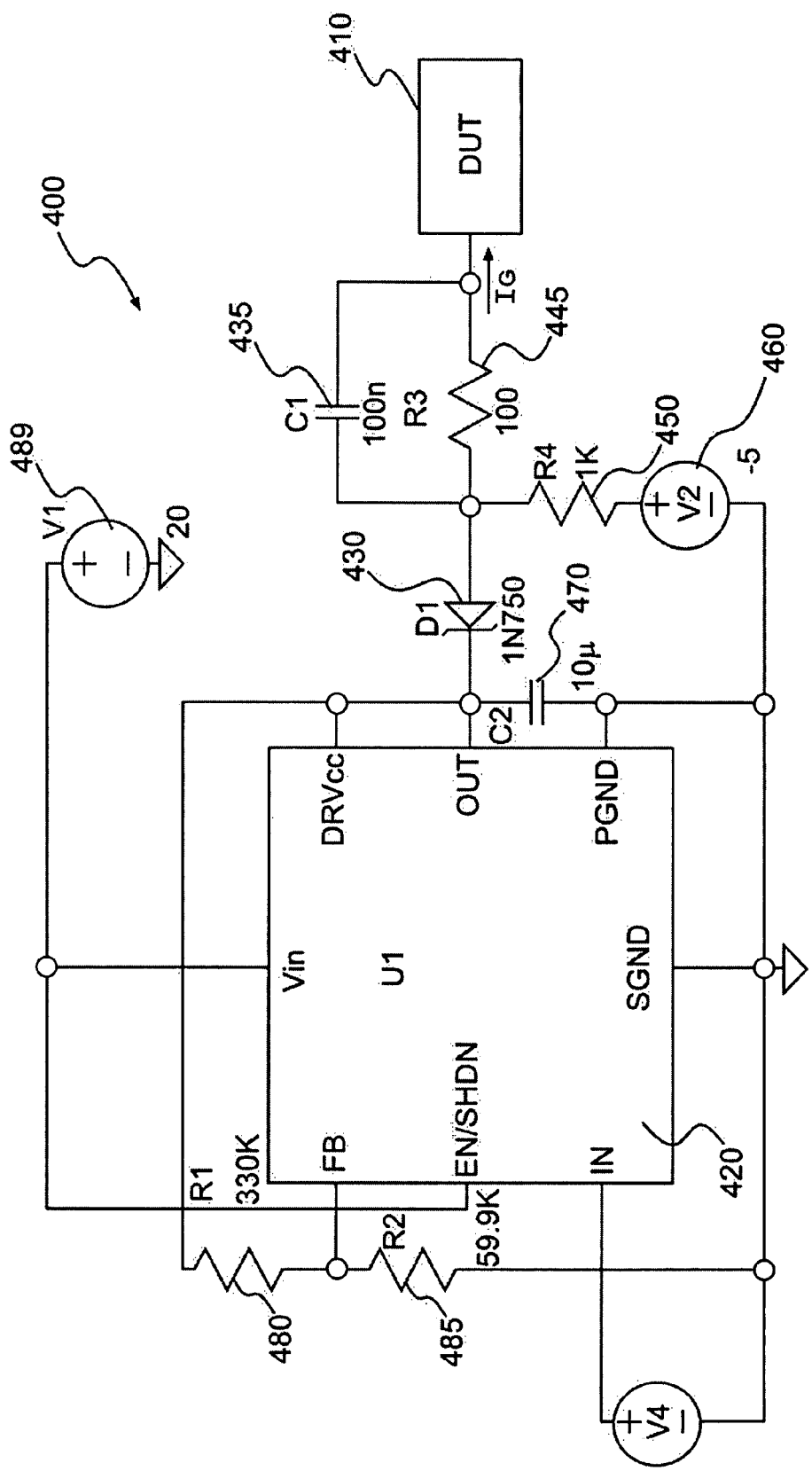
FIG. 4 shows a gate drive circuit for a wide bandgap semiconductor junction gated transistor, in accordance with an embodiment.

FIG. 4 shows a gate drive circuit 400 for a wide bandgap semiconductor junction gated transistor, in accordance with an embodiment. The gate drive circuit 400 is coupled to a device under test (DUT) 410, which may be any type of wide bandgap semiconductor junction gated transistor (e.g., a VJFET, JFET, SIT, MESFET, or cascode JFET). The junction gated transistor may be a Schottky gated or a P-N junction gated transistor. The wide bandgap semiconductor may be SiC, GaN, diamond or any other wide bandgap semiconductor. The gate drive circuit 400 limits current delivered to the DUT 410 in the on-state, and provides the transient charging and discharging currents needed for the gate-source capacitance.

The gate drive or control circuit 400 includes a gate drive chip 420. The gate drive chip 420 may be any type of transistor gate driver, such as a MOSFET gate driver or a insulated gate bipolar transistor (IGBT) gate driver. In one example, the gate driver 420 may be a gate driver manufactured by Linear Technologies, Inc., such as LTC4441 or LTC4441-1, or the gate driver 420 may be any other type of gate driver. As shown, the resistor (R1) 480 is coupled to resistor (R2) 485, the regulator feedback input pin (FB), the line regulator output pin (DRVcc) and capacitor (C2) 470. The resistor 485 is also coupled to the regulator feedback input pin on one end and signal ground (SGND) on the other end. The capacitor 470 is further coupled to the driver ground pin (PGND) and SGND. Resistors 480 and 485 set the output drive voltage (OUT), which may be limited to a minimum voltage (e.g., 5 V), for example. The voltage in ("Vin") pin provides the main supply input and the IN pin provides the driver logic input. The enable/shutdown (EN/SHDN) input pin is also coupled to the Vin pin.

In accordance with an embodiment, the driver output pin (OUT) is coupled to diode (D1) 430, which is coupled to capacitor (C1) 435 and resistor (R3) 445. The diode 430 may also be coupled to a shutoff voltage source 460 through shut-off resistor 450. The shutoff voltage source 460 may provide a negative shutoff voltage to turn off the DUT 410 (i.e., the semiconductor junction gated transistor). The capacitor 435 and resistor 445 are coupled in parallel to the diode 430 on one end and the DUT 410 on the other end, as shown. The capacitor 435 and resistor 445 are typically coupled to the gate input (not shown) of the DUT 410. The resistor 445 is a gate current limit resistor that limits the gate current ($I_G$) provided to the gate input of the DUT 410. The gate current limit resistor may limit the gate current input to the DUT 410 even if the ambient temperature increases (i.e., in high temperature environments). The capacitor 435 is a AC-coupled charging capacitor which charges and discharges the gate input capacitance during switching events.

In order to ensure stable operation of the gate drive chip 420, the input voltage V1 489 needs to remain above a critical value. On the other hand, the gate input voltage to the DUT 410 can be much less than the critical value of the input voltage V1 489 needed by the gate drive chip 420 and it becomes necessary to reduce the output voltage by means of level shifting. In an embodiment of the invention, voltage level shifting is achieved with the diode 430, which may be a Zener diode or other type of diode. The shutoff voltage 460 can provide the turn off voltage for the DUT 410 if a more negative turn off voltage is desired. The value of resistor 445 may be set to limit the current of the parasitic P-N gate to source diode regardless of the temperature. The output voltage (OUT) of the gate drive chip 420 is used to approximate the size of the current limiting resistor 445 using the formula $R_{limit} = V_{OUT}/I_{gate-source}$. To achieve a high peak current for fast DUT 410 turn-on, capacitor 435 allows for a capacitive coupled gate drive and can be sized for the appropriate turn on speed by sizing the capacitor 435 equal to the input gate capacitance of the DUT 410. The charged or discharged capacitor 435 can be used to charge or discharge the input capacitance of the DUT 410 during the switching process. It should be noted that the parasitic diode on the gate of the transistor (e.g., a LV VJFET) consumes any excess current which the charge capacitor 435 emits during switching in the event the capacitor 435 is sized larger than necessary.

For cost and availability reasons, it is desirable to configure a SiC cascode gate drive from a commercial gate drive circuits. However, conventional commercial gate drive circuits may have to be specially configured to achieve the required output voltage and current for optimal device performance. Changes in temperature can result in a lower parasitic P-N junction turn-on voltage and may result in the diode 430 turning on at voltages much less than 2.5 V, for the case of SiC. However, the gate current limit resistor 445 is set to handle such temperature changes.

Typically, conventional Si gate drives can provide up to 20 V of gate driving capability and possibly up to 12 A of peak current capability. This peak current is required to charge the gate capacitances of Si devices as quickly as possible to allow for fast turn on speed. As seen in FIG. 3, SiC devices may only require 2.5 V of gate voltage at room temperature to fully operate. Driving the device with anything more than 2.5 V results in forward biasing the gate-to-source parasitic P-N junction diode and conducting large amounts of gate current. Most conventional gate drive circuits cannot handle this much continuous gate current and do not perform well when the input voltage V1 489 is lowered to less than 5 V to attempt to drive gate voltages less than 5 V. Using a conventional gate drive circuit with the output set to 5V would turn on the P-N junction diode, thus conducting large amounts of gate current through the SiC device and possibly destroying the gate drive chip.

Figure 5:
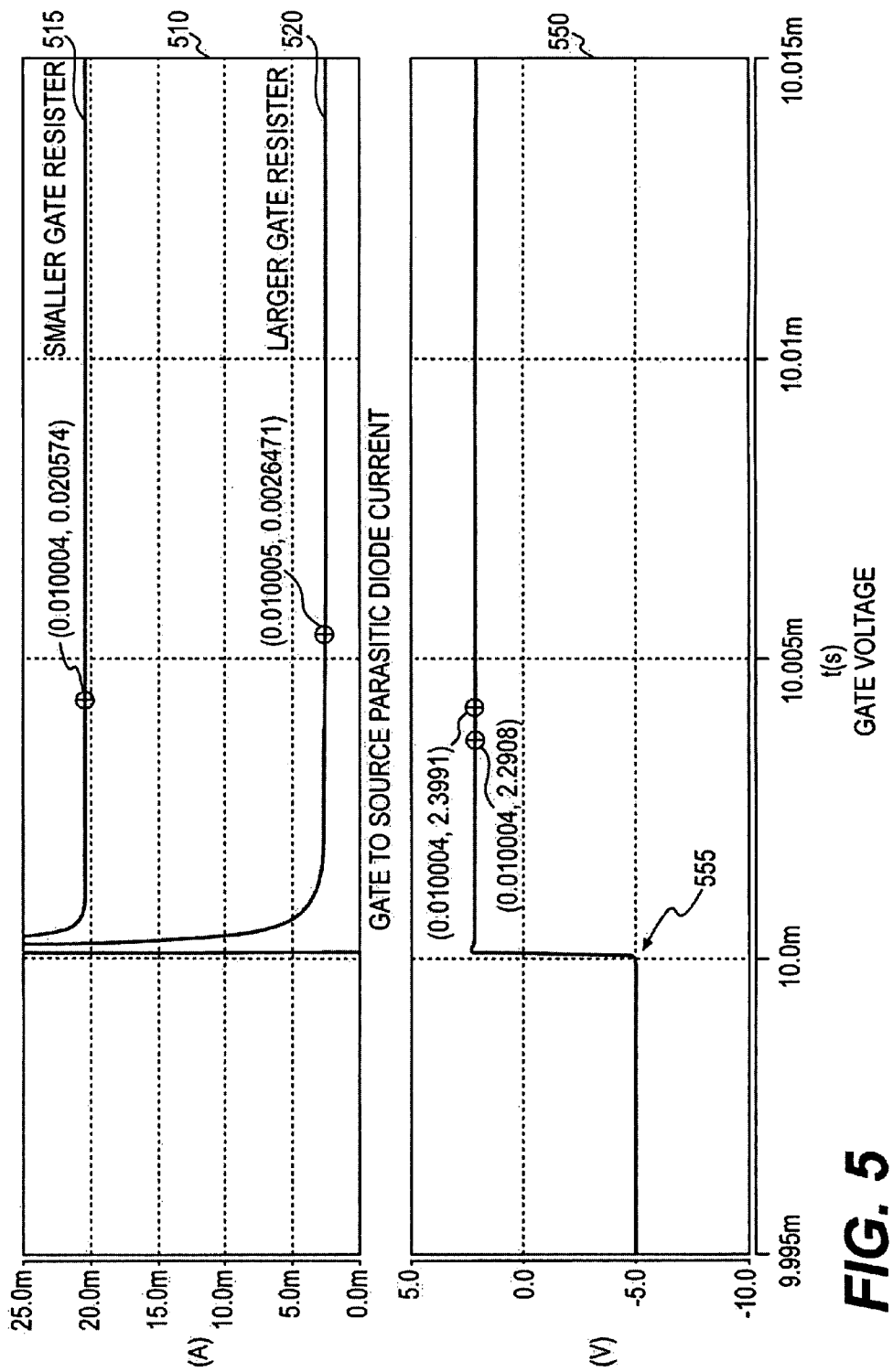
FIG. 5 is a simulation output of a model SiC JFET device circuit configured in accordance with an embodiment.

FIG. 5 is a simulation output of a model SiC JFET device circuit configured in accordance with an embodiment. Upper graph 510 shows the current being drawn by the parasitic gate-source P-N gated transistor at steady state using two different resistors (e.g., a "small" gate resistor and a "large" gate resistor). As evident by comparing waveforms 515 and 520, a 10× reduction in gate current can be achieved by increasing the size of the current limiting resistor R3, thus resulting in lower power consumption. The resistor is sized to limit gate current, while maintaining low on-state resistance. The charging of the JFET input gate capacitance when the device is turned on 555, as shown by lower graph 550, is accomplished by the capacitor C1 435 despite the current limit imposed by resistor 435.

Several embodiments of the present invention are specifically illustrated and/or described herein. However, it will be appreciated that modifications and variations of the present invention are covered by the above teachings and within the purview of the appended claims without departing from the spirit and intended scope of the invention.

What is claimed is:

1. A gate drive circuit for a wide bandgap semiconductor junction gated transistor, comprising:
    a gate current limit resistor coupled to a gate input of the wide bandgap semiconductor junction gated transistor when in use, wherein the gate current limit resistor limits a gate current, provided to the gate input of the wide bandgap semiconductor junction gated transistor, as an ambient temperature increases;
    a AC-coupled charging capacitor coupled to the gate input of the wide bandgap semiconductor junction gated transistor when in use, wherein the AC-coupled gate charging capacitor is positioned parallel to the gate current limit resistor; and
    a diode coupled to the gate current limit resistor and the AC-coupled charging capacitor on one end and an output of a gate drive chip on the other end, wherein when in use the diode lowers a gate voltage output from the gate drive chip applied to the gate input of the wide bandgap semiconductor junction gated transistor through the gate current limit resistor.

2. The gate drive circuit of claim 1, further comprising the wide bandgap semiconductor junction gated transistor.

3. The gate drive circuit of claim 2, wherein the wide bandgap semiconductor is selected from a group consisting of silicon carbide, gallium nitride and diamond.

4. The gate drive circuit of claim 2, wherein the wide bandgap semiconductor junction gated transistor comprises a Schottky gate or a P-N junction gate.

5. The gate drive circuit of claim 1, wherein the wide bandgap semiconductor junction gated transistor is a junction field effect transistor (JFET), vertical JFET (VJFET), static induction transistor (SIT), Metal Semiconductor Field Effect Transistor (MESFET), or a cascode JFET circuit.

6. The gate drive circuit of claim 1, wherein the gate drive chip is a controller chip used to control a metal-oxide semiconductor field-effect transistor (MOSFET) or IGBT.

7. The gate drive circuit of claim 1, wherein the diode is a Zener diode.

8. A gate drive circuit for a wide bandgap semiconductor junction gated transistor, comprising:
a gate current limit resistor coupled to a gate input of the wide bandgap semiconductor junction gated transistor when in use, wherein the gate current limit resistor limits a gate current provided to the gate input of the junction gated transistor;
a AC-coupled charging capacitor coupled to the gate input of the wide bandgap semiconductor junction gated transistor when in use, wherein the AC-coupled gate charging capacitor is positioned parallel to the gate current limit resistor;
a diode coupled to the gate current limit resistor and the AC-coupled charging capacitor on one end and an output of a gate drive chip on the other end, wherein when in use the diode lowers a gate voltage output from the gate drive chip applied to the gate input of the wide bandgap semiconductor junction gated transistor through the gate current limit resistor;
a shutoff voltage source;
a shutoff resistor coupled to the shutoff voltage source at one end and at another end coupled to the diode and the AC-coupled charging capacitor, wherein the shutoff voltage source and the shutoff resistor turn off the wide bandgap semiconductor junction gated transistor.

9. The gate drive circuit of claim 8, further comprising the wide bandgap semiconductor junction gated transistor.

10. The gate drive circuit of claim 9, wherein the wide bandgap semiconductor junction gated transistor comprises a Schottky gate or a P-N junction gate.

11. The gate drive circuit of claim 9, wherein the wide bandgap semiconductor junction gated transistor is a junction field effect transistor (JFET), vertical JFET (VJFET), static induction transistor (SIT), Metal Semiconductor Field Effect Transistor (MESFET), or a cascode JFET circuit.

12. The gate drive circuit of claim 9, wherein the wide bandgap semiconductor is selected from consisting of silicon carbide, gallium nitride and diamond.

13. A gate drive circuit for a wide bandgap semiconductor junction gated transistor, comprising:
a gate drive chip, wherein the gate drive chip receives an input signal and generates an output signal;
a diode coupled to the output signal of the gate drive chip;
a gate current limit resistor, wherein when the gate drive circuit is in use, the gate current limit resistor is coupled to the diode and a gate of the wide bandgap semiconductor junction gated transistor and the gate current limit resistor limits the gate current to a maximum value, at the gate input of the wide bandgap semiconductor junction gated transistor, as an ambient temperature increases; and
a AC-coupled charging capacitor, wherein when the gate drive circuit is in use, the AC-coupled charging capacitor is coupled to the diode and the gate current limit resistor at the gate of the junction gated transistor, wherein the AC-coupled charging capacitor is parallel to the gate current limit resistor.

14. The gate drive circuit of claim 13, wherein the gate drive chip is a controller chip used to control a metal-oxide semiconductor field-effect transistor (MOSFET) or IGBT.

15. The gate drive circuit of claim 13, wherein the diode is a Zener diode.

16. A gate drive circuit for a wide bandgap semiconductor junction gated transistor, comprising:
a gate current limit resistor coupled to a gate input of the wide bandgap semiconductor junction gated transistor when in use, wherein the gate current limit resistor limits a gate current provided to the gate input of the wide bandgap semiconductor junction gated transistor;
a AC-coupled charging capacitor coupled to the gate input of the wide bandgap semiconductor junction gated transistor when in use, wherein the AC-coupled charging capacitor is positioned parallel to the gate current limit resistor;
a gate drive chip, wherein the gate drive chip provides a voltage to the gate limit resistor and the AC-coupled charging capacitor, and wherein the wide bandgap semiconductor junction gated transistor is a Schottky diode or a P-N junction diode; and
a diode coupled to the gate current limit resistor and the AC-coupled charging capacitor on one end and an output from the gate drive chip on the other end, wherein the diode limits a gate voltage output from the gate drive chip applied to the gate input of the wide bandgap semiconductor junction gated transistor when in use, and wherein the diode is a Zener diode.

* * * * *